United States Patent
Nitta et al.

(10) Patent No.: US 10,611,148 B2
(45) Date of Patent: Apr. 7, 2020

(54) INK JET HEAD AND INK JET PRINTER

(71) Applicant: TOSHIBA TEC KABUSHIKI KAISHA, Tokyo (JP)

(72) Inventors: Noboru Nitta, Tagata Shizuoka (JP); Shinichiro Hida, Numazu Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/276,117

(22) Filed: Feb. 14, 2019

(65) Prior Publication Data

US 2019/0255851 A1    Aug. 22, 2019

(30) Foreign Application Priority Data

Feb. 20, 2018 (JP) ................................. 2018-027577

(51) Int. Cl.
*B41J 2/14* (2006.01)
*B41J 2/045* (2006.01)
(Continued)

(52) U.S. Cl.
CPC ....... *B41J 2/14072* (2013.01); *B41J 2/04541* (2013.01); *B41J 2/04581* (2013.01);
(Continued)

(58) Field of Classification Search
CPC .................. B41J 2/17526; B41J 2/14072; B41J 2/14201; B41J 2/04541; B41J 2/04581;
(Continued)

(56) References Cited

U.S. PATENT DOCUMENTS

| | | |
|---|---|---|
| 6,190,006 B1 | 2/2001 | Kurashima et al. |
| 2003/0063449 A1 | 4/2003 | Suzuki et al. |
| 2005/0286240 A1 | 12/2005 | Sakamoto et al. |
| 2006/0170738 A1 | 8/2006 | Kato |

(Continued)

FOREIGN PATENT DOCUMENTS

| | | |
|---|---|---|
| JP | 3525046 B2 | 5/2004 |
| JP | 2007083707 A | 4/2007 |

(Continued)

OTHER PUBLICATIONS

Extended European Search Report dated Jun. 28, 2019, filed in counterpart European Patent Application No. 19158033.1, 9 pages.
(Continued)

*Primary Examiner* — Juanita D Jackson
(74) *Attorney, Agent, or Firm* — Kim & Stewart LLP

(57) ABSTRACT

An ink jet head includes a head substrate, a flexible substrate, and a relay substrate. The head substrate includes ink jet elements and a common wiring that extends from an edge of the head substrate and electrically connects in common to the ink jet elements. The flexible substrate is coupled to the head substrate at a first edge and includes a drive circuit, a common connection wiring that extends between the first edge and a second edge opposite the first edge and is electrically connected to the common wiring, and a first reference potential wiring electrically connected to a reference voltage terminal of the drive circuit and disposed separately from the common connection wiring. The flexible substrate includes an output monitor wiring extending from an output terminal of the driver circuit to the second edge through a region between the common connection wiring and the first reference potential wiring.

20 Claims, 13 Drawing Sheets

(51) Int. Cl.
  *B41J 2/175* (2006.01)
  *H01L 41/04* (2006.01)
  *H01L 41/047* (2006.01)
  *H01L 41/09* (2006.01)
  *H05K 1/18* (2006.01)
  *H05K 1/14* (2006.01)
  *H01L 23/538* (2006.01)

(52) U.S. Cl.
  CPC .. *B41J 2/17526* (2013.01); *B41J 2002/14459* (2013.01); *B41J 2002/14491* (2013.01); *B41J 2202/11* (2013.01); *H01L 23/5387* (2013.01); *H01L 41/042* (2013.01); *H01L 41/0475* (2013.01); *H01L 41/0973* (2013.01); *H05K 1/147* (2013.01); *H05K 1/189* (2013.01); *H05K 2201/10681* (2013.01)

(58) Field of Classification Search
  CPC .... B41J 2002/14491; B41J 2002/14459; B41J 2202/11; H01L 41/042; H01L 41/0475; H01L 41/0973; H01L 23/5387; H05K 1/147; H05K 1/189; H05K 2201/10681
  See application file for complete search history.

(56) References Cited

U.S. PATENT DOCUMENTS

| | | | |
|---|---|---|---|
| 2007/0222837 A1* | 9/2007 | Tajima | B41J 2/175 |
| 2008/0074795 A1 | 3/2008 | Kobayashi | |
| 2012/0186859 A1 | 7/2012 | Yamashita | |
| 2016/0193837 A1* | 7/2016 | Kudo et al. | B41J 2/14088 |
| 2017/0239940 A1 | 8/2017 | Yamashita | |
| 2017/0282554 A1* | 10/2017 | Kato et al. | B41J 2/1433 |

FOREIGN PATENT DOCUMENTS

| | | |
|---|---|---|
| JP | 2008-141078 A | 6/2008 |
| JP | 2009004278 A | 1/2009 |
| JP | 4815296 B2 | 11/2011 |

OTHER PUBLICATIONS

U.S. Appl. No. 16/276,179, filed Feb. 14, 2019 (First Inventor: Noboru Nitta).

U.S. Appl. No. 16/277,542, filed Feb. 15, 2019 (First Inventor: Noboru Nitta).

U.S. Appl. No. 16/278,934, filed Feb. 19, 2019 (First Inventor: Noboru Nitta).

* cited by examiner

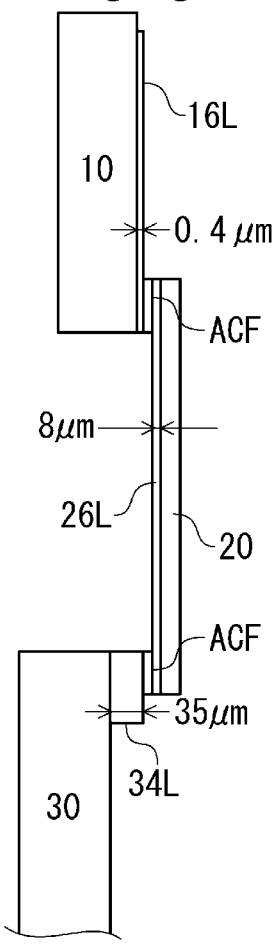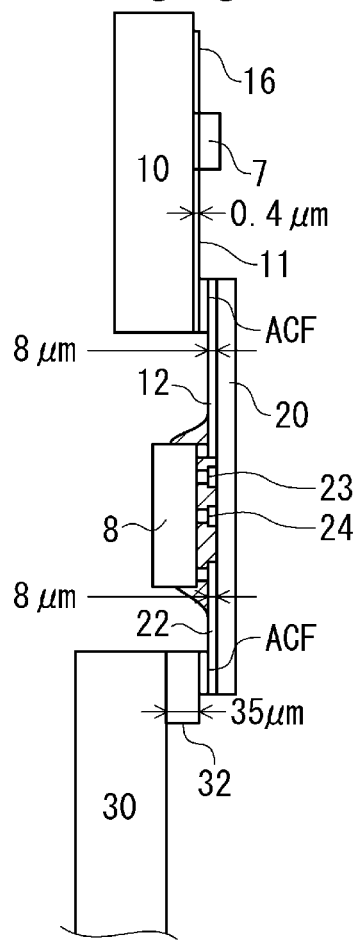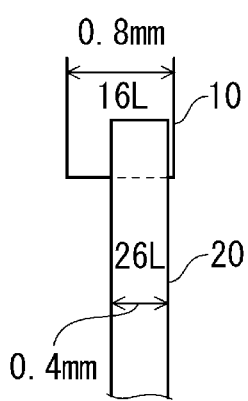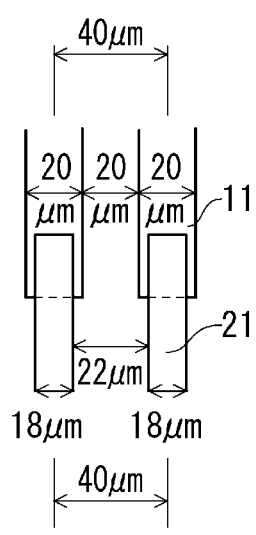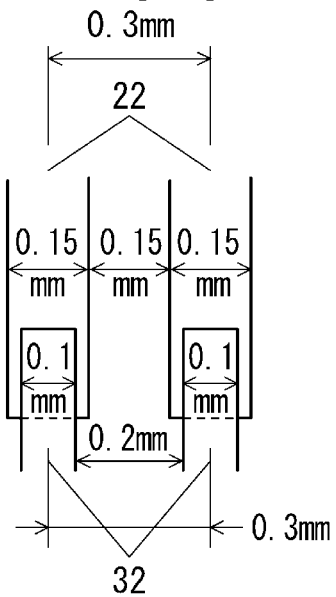

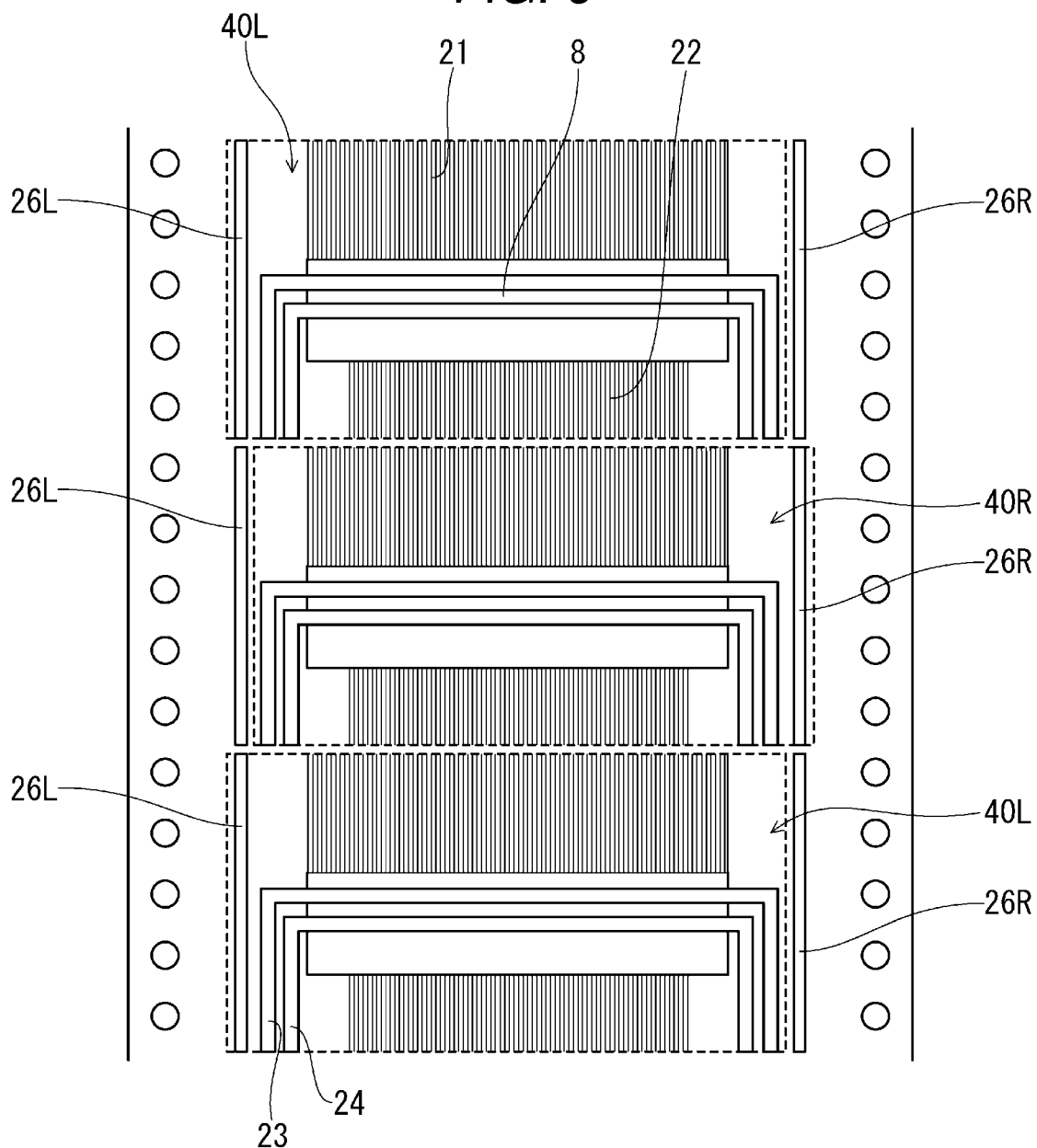

INK JET HEAD AND INK JET PRINTER

CROSS-REFERENCE TO RELATED APPLICATION

This application is based upon and claims the benefit of priority from Japanese Patent Application No. 2018-027577, filed Feb. 20, 2018, the entire contents of which are incorporated herein by reference.

FIELD

Embodiments described herein relate generally to an ink jet head and an ink jet printer.

BACKGROUND

An ink jet head includes a flow path formation member in which a plurality of ink chambers are formed, a nozzle plate on which a plurality of nozzles that communicate with the respective ink chambers are formed, and a head substrate on which a plurality of elements, such as actuators, corresponding to the ink chambers are arranged.

The head substrate may be connected to a printer control unit via a flexible substrate, a relay substrate, a cable, and the like. A drive integrated circuit (IC) chip that drives the plurality of elements may be mounted on the flexible substrate in some cases.

The drive IC chip outputs drive power in accordance with a command from the printer control unit and supplies drive power to the elements. In this manner, the elements are deformed or caused to generate heat, and thus an ink pressure in a pressure chamber increases, and ink is ejected from the nozzles.

Discrete wirings for supplying drive signals and a common wiring for supplying a reference potential (ground potential) may be connected to the respective elements.

The common wiring may be disposed through a different route without the flexible substrate interposed therebetween or may be disposed via the drive IC chip on the flexible substrate.

If the common wiring is disposed through a route that is different from the flexible substrate, the wiring may become long and complicated. This may increase noise or lead to degradation of ejection properties due to voltage dropping. Also, a wiring connecting operation may become cumbersome.

However, if the common wiring is disposed via the drive IC chip on the flexible substrate, improper operations of the drive IC chip may occur due to noise that is transmitted through the common wiring. Also, the common wiring may need to be formed with a thin width, and this may lead to degradation of ejection properties due to voltage dropping. If the width of the common wiring is increased, an area of the drive IC chip may increase.

DESCRIPTION OF THE DRAWINGS

FIG. 1A illustrates an example and FIG. 1B illustrates a modification example.

FIG. 2A illustrates a state before bonding and FIG. 2B illustrates a state after bonding.

FIGS. 3A to 3E are diagrams illustrating the inkjet head according to the first embodiment, where FIG. 3A illustrates a cross-sectional view along A-A in FIG. 2B, FIG. 3B illustrates a cross-sectional view along B-B in FIG. 2B, FIG. 3C illustrates an enlarged view of a part C in FIG. 2B, and FIG. 3D is an enlarged view of a part D in FIG. 2B, and FIG. 3E is an enlarged view of a part E in FIG. 2B.

FIG. 5A illustrates a state before bonding and FIG. 5B illustrates a state after bonding.

FIG. 6 is a diagram illustrating flexible substrates formed in a sprocket film.

FIG. 12A illustrates two flexible substrates separated from each other, and FIG. 12B illustrates two flexible substrates arranged in the vicinity of each other.

DETAILED DESCRIPTION

Figure 1A:
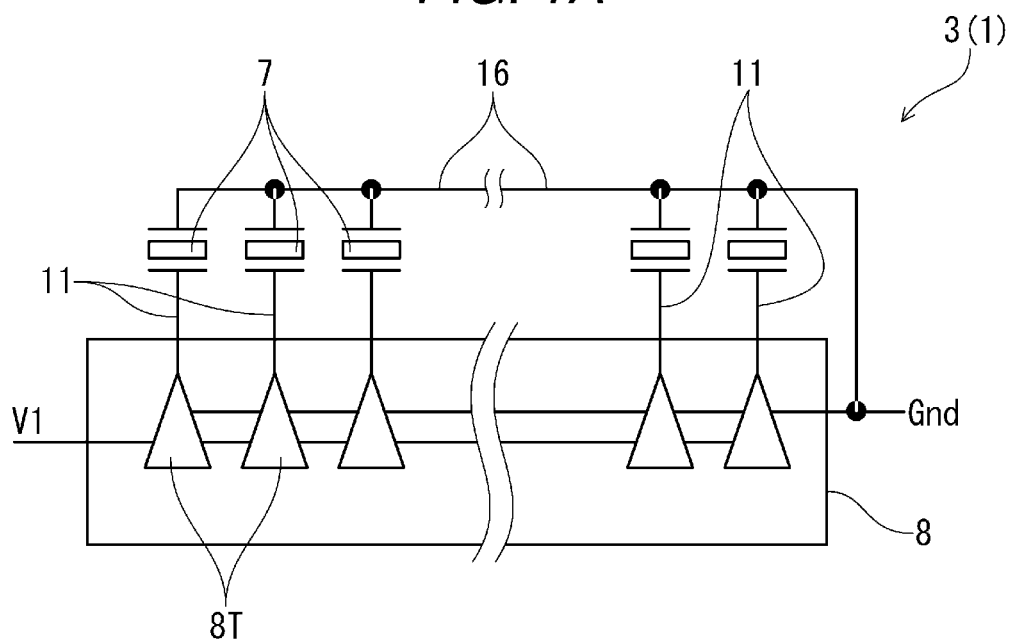
FIGS. 1A and 1B are diagrams illustrating a configuration of an electrical circuit in an ink jet head according to an embodiment, where

An embodiment is directed to providing an ink jet head and an ink jet printer without a complicated and thin common wiring on a flexible substrate.

An ink jet head according to an embodiment includes a head substrate, a flexible substrate, and a relay substrate. The head substrate includes a plurality of ink jet elements thereon. The plurality of ink jet elements are configured to cause ink to be ejected from a plurality of nozzles. A common wiring extends from an edge of the head substrate and is electrically connected to the inkjet elements in common. The flexible substrate is coupled to the edge of the head substrate at a first edge and includes a drive circuit thereon. The drive circuit is configured to drive the ink jet elements. A common connection wiring extends between the first edge of the flexible substrate and a second edge of the flexible substrate opposite to the first edge. The common connection wiring is electrically connected to the common wiring. A first reference potential wiring is disposed separately from the common connection wiring on the flexible substrate, extends from the second edge of the flexible substrate, and is electrically connected to a reference voltage terminal of the drive circuit. The relay substrate is coupled to the second edge of the flexible substrate. The relay substrate includes a second reference potential wiring that is electrically connected to the common connection wiring and the first reference potential wiring.

Hereinafter, an ink jet head and an ink jet printer according to certain example embodiments will be described with reference to drawings. In the respective drawings, the same reference numerals will be used for the same aspects.

First Embodiment

Ink Jet Heads 3

Figure 1B:
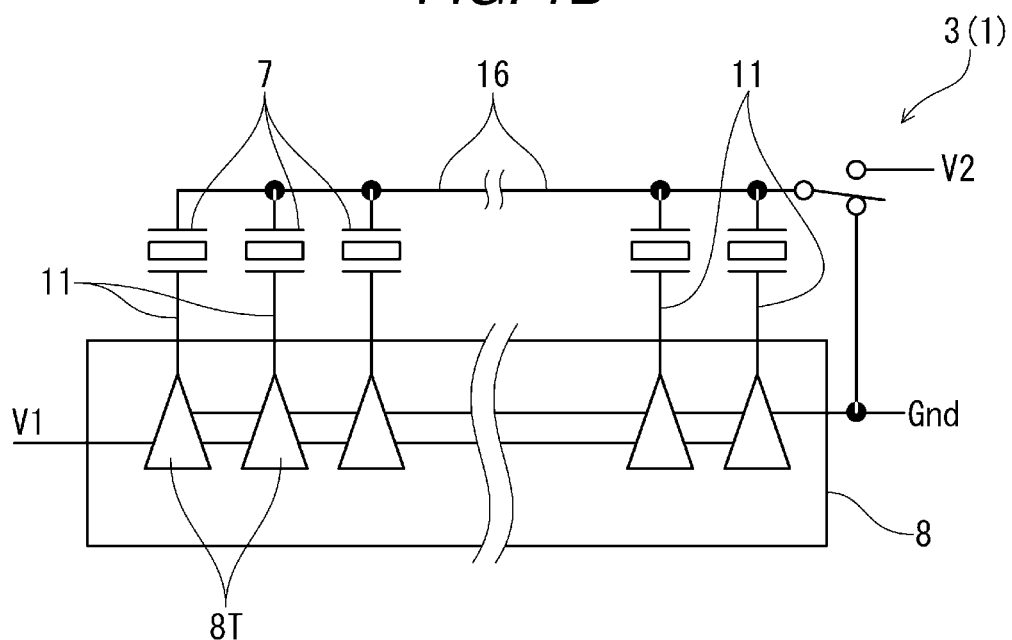

FIGS. 1A and 1B are diagrams illustrating a configuration of electrical circuits in an ink jet head 3 according to an embodiment, where FIG. 1A illustrates an example and FIG. 1B illustrates a modification of the FIG. 1A example.

The ink jet printer 1 includes a plurality of ink jet heads 3. The ink jet printer 1 includes an ink supply unit configured to supply ink to the ink jet heads 3, a medium transport unit configured to transport a recording medium to the ink jet heads 3, a printer control unit, and the like.

Each ink jet head 3 includes a plurality of actuators 7, a drive IC 8, and the like. The drive IC 8 includes a drive circuit including output transistors 8T.

Each of the actuators 7 has one end connected to a discrete wiring 11 and the other connected to a common wiring 16.

The discrete wiring 11 is a wiring that is discretely connected to a corresponding one of the actuators 7 and is connected to the drive IC 8. The common wiring 16 is a shared wiring that is connected to the actuators 7 and is grounded. That is, each actuator 7 is connected to a drive circuit of the drive IC 8 via a different one of the discrete wirings 11 and is connected to a reference potential GND (0 V) via the shared common wiring 16.

The drive circuit of the drive IC 8 controls the output transistors 8T to selectively have a drive potential V1 and a reference potential GND. If the drive circuit of the drive IC 8 controls an output transistor 8T to have the drive potential V1, the corresponding actuator 7 is changed with the drive potential V1. If the drive circuit of the drive IC 8 controls an output transistor 8T to have the reference potential GND, the corresponding actuator 7 is caused to discharge electricity to reach the reference potential GND.

Figure 2A:
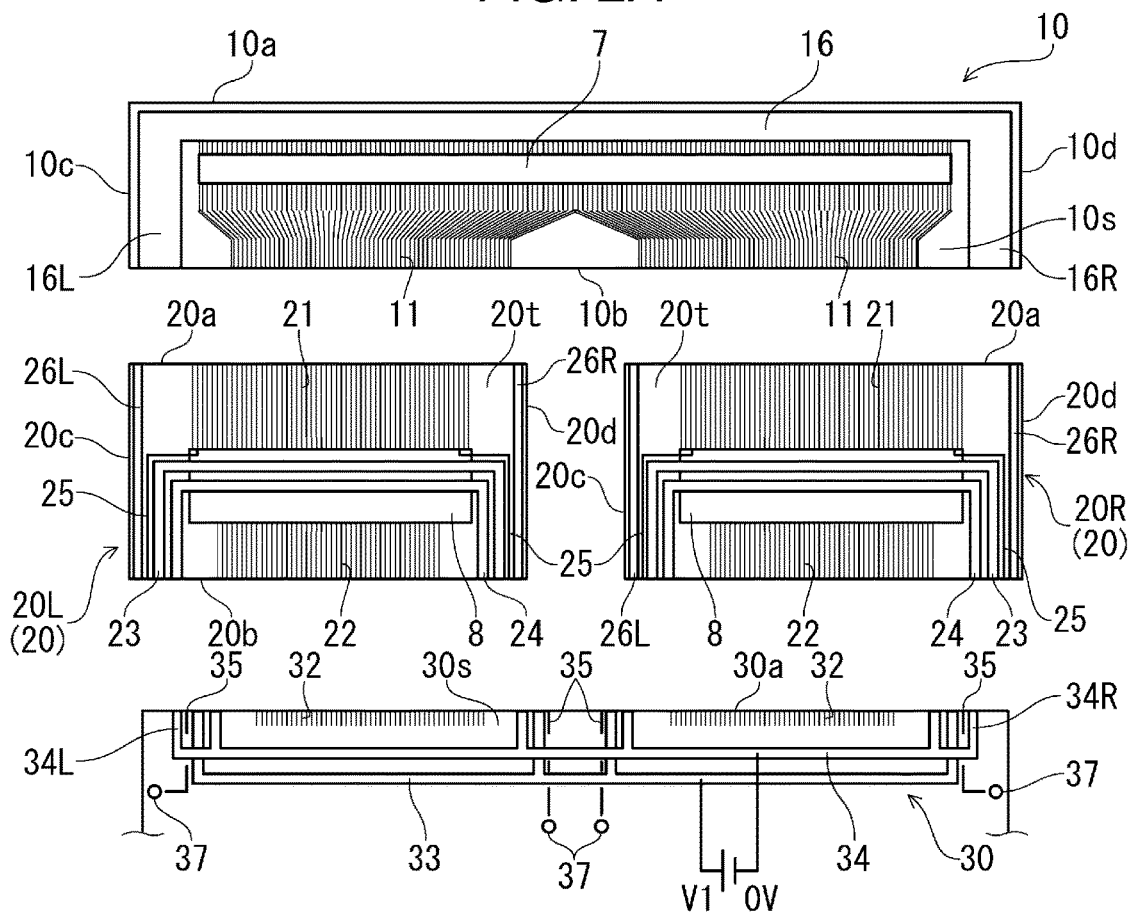
FIGS. 2A and 2B are diagrams illustrating an ink jet head according to a first embodiment, where
Figure 2B:
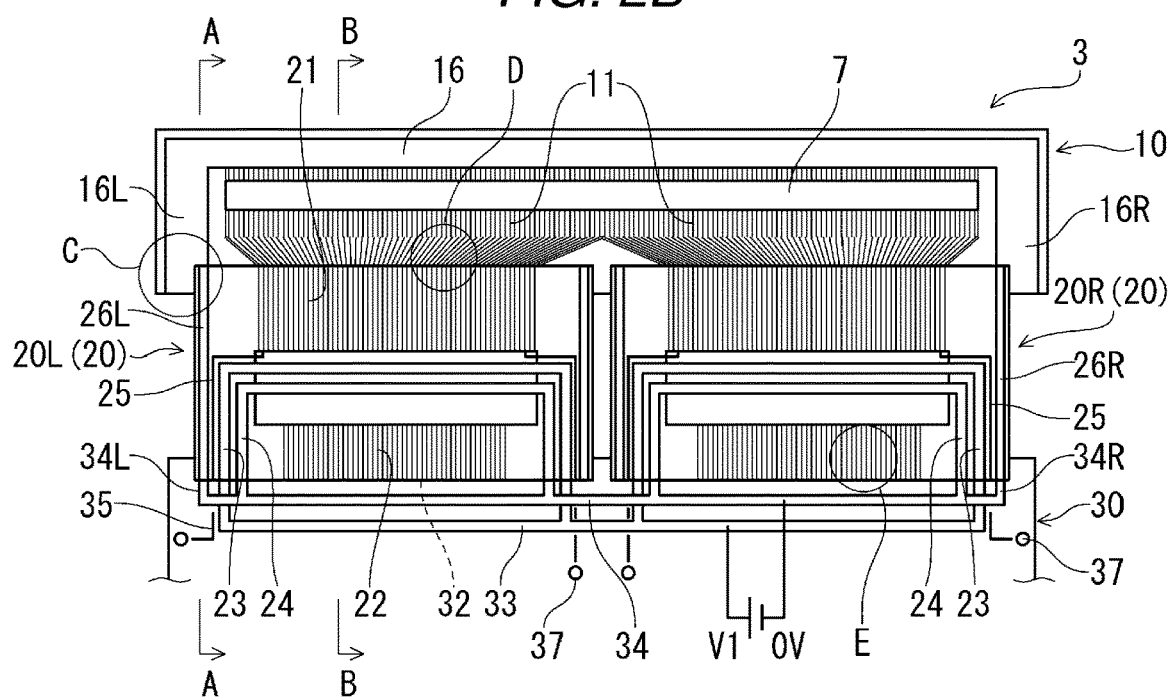

FIGS. 2A and 2B are diagrams illustrating an ink jet head 3 according to a first embodiment, where FIG. 2A illustrates a state before bonding and FIG. 2B illustrates a state after bonding. A flexible substrate 20 and a relay substrate 30 are illustrated with wirings and the like in a manner in which the wirings and the like are seen through the respective substrates, for convenience of explanation. The relay substrate 30 may be referred to as a "print substrate" in some contexts.

FIGS. 3A to 3E illustrate diagrams illustrating the ink jet head according to the first embodiment, where FIG. 3A illustrates a cross-sectional view along A-A in FIG. 2B, FIG. 3B illustrates a cross-sectional view along B-B in FIG. 2B, FIG. 3C illustrates an enlarged view of a part C in FIG. 2B, FIG. 3D illustrates an enlarged view of a part D in FIG. 2B, and FIG. 3E illustrates an enlarged view of a part E in FIG. 2B. Only the respective wirings are illustrated in FIGS. 3C to 3E for convenience of explanation.

The ink jet head 3 includes a head substrate 10, a flexible substrate 20, and a relay substrate 30.

In the head substrate 10, a plurality of actuators 7 corresponding to ink chambers, respectively, are arranged. The flexible substrate 20 and the relay substrate 30 are bonded to the head substrate 10.

In the following description, the longitudinal direction of the head substrate 10 will be referred to as X direction or a left-right direction. +X direction will be referred to as a right direction, and −X direction will be referred to as a left direction. The end in −X direction (first terminal) and the end in +X direction (second end) will collectively be referred to as both ends.

The short side direction of the head substrate 10 will be referred to as Y direction or an upper-lower direction. +Y direction will be referred to as an upper direction or an output direction, and −Y direction will be referred to as a lower direction or an input direction. The thickness direction of the head substrate 10 will be referred to as Z direction. +Z direction will be referred to as a front direction, and −Z direction will be referred to as a rear direction.

In addition, electrical coupling will be referred to as connection, and physical coupling will be referred to as bonding.

The head substrate 10, the flexible substrate 20, and the relay substrate 30 are sequentially bonded to each other in Y direction. The head substrate 10 is arranged in +Y direction with respect to two flexible substrates 20, the relay substrate 30 is arranged in −Y direction with respect to the two flexible substrates 20. That is, the two flexible substrates 20 are bridged in parallel between the head substrate 10 and the relay substrate 30.

An edge 20a on the output side of the flexible substrate 20 overlaps an edge 10b on the input side of the head substrate 10. An edge 20b on the input side of the flexible substrate 20 overlaps an edge 30a on the output side of the relay substrate 30.

Head Substrate 10

Figure 10:
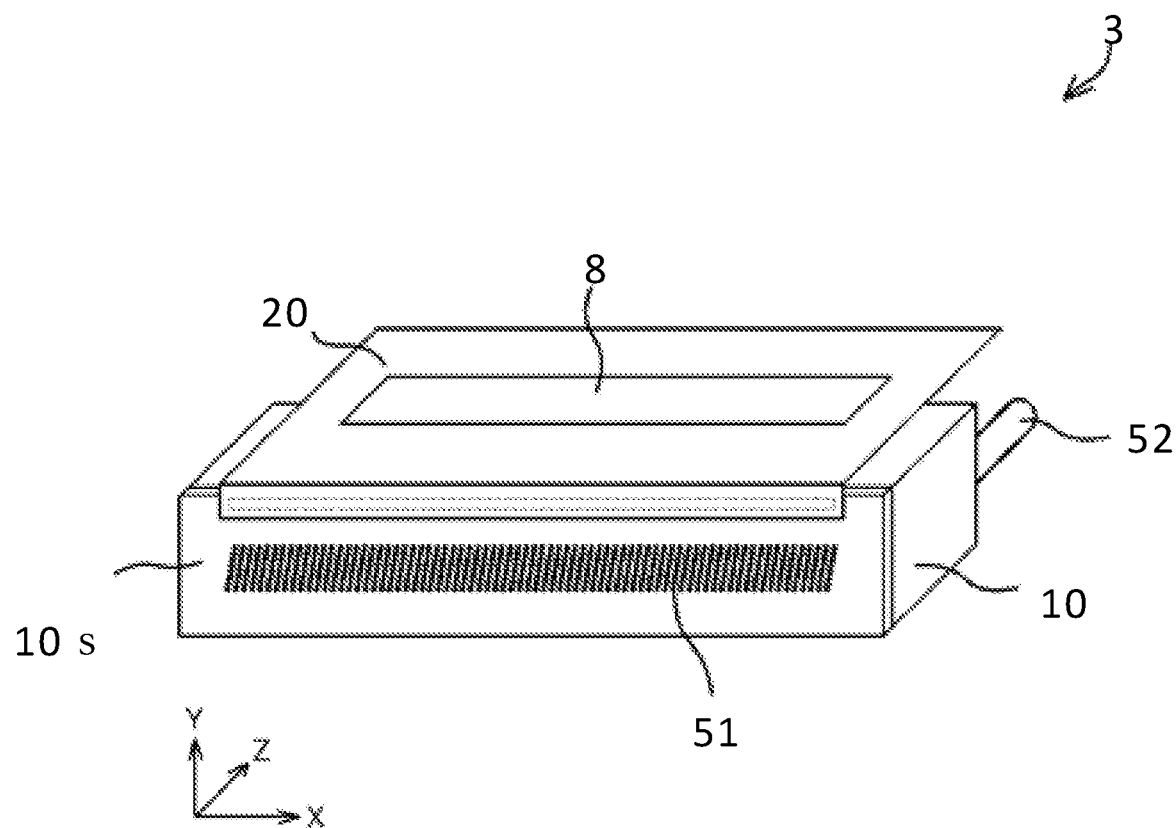
FIG. 10 illustrates a perspective view of the inkjet head.
Figure 11:
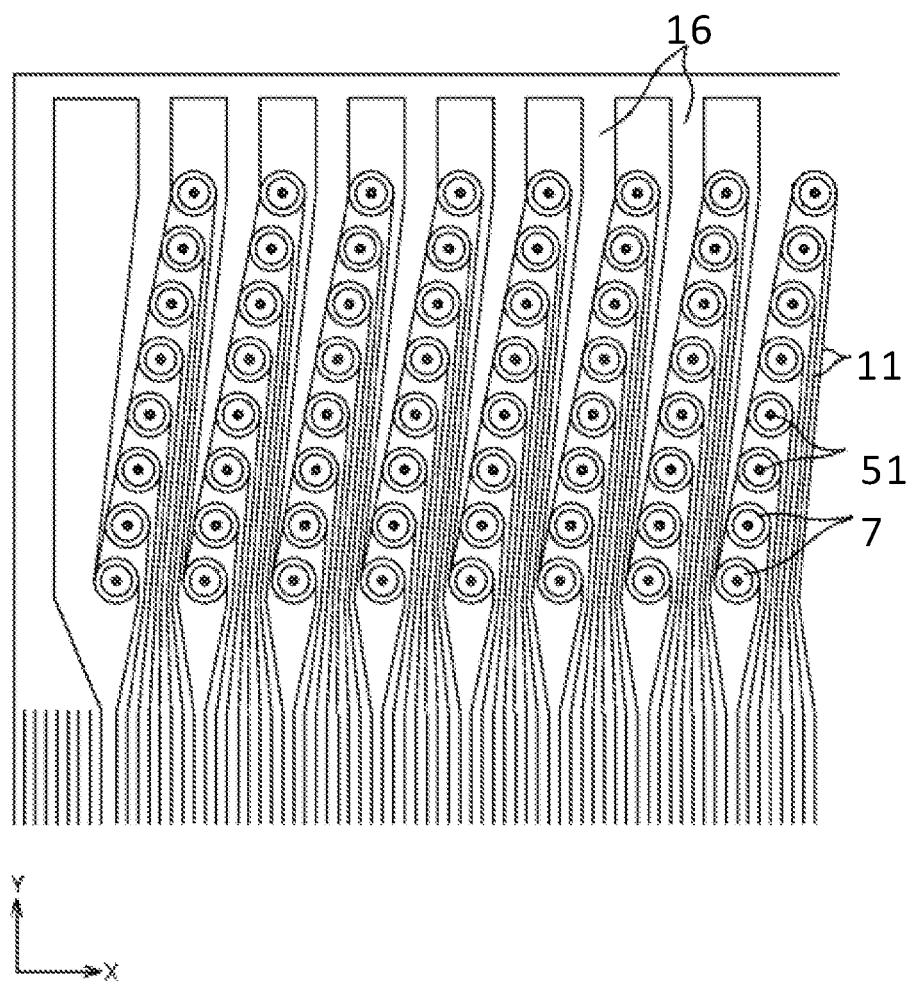
FIG. 11 illustrates a partially enlarged view of a front surface of the head substrate.

FIG. 10 illustrates a perspective view of the inkjet head 3. FIG. 11 illustrates a partially enlarged view of a front surface (nozzle plate) 10s of the head substrate 10. The head substrate 10 is a one-sided hard substrate made of silicon or glass, and a planar shape thereof is a rectangular shape. The head substrate 10 has a plurality of actuators 7. The actuators 7 are piezoelectric elements. The plurality of actuators 7 are formed by microelectromechanical systems (MEMS) and are arranged on a front surface 10s of the head substrate 10. The actuator 7, which is a driving source for ejecting ink, is provided for each nozzle 51. Each of the actuators 7 is formed in an annular shape, and the actuators 7 are arranged so that the nozzles 51 are located at the center thereof.

The plurality of actuators 7 are arranged in parallel in the left-right direction. In one implementation, the actuator 7 includes eight actuators 7 arranged in Y axis direction as one set in X axis direction. For example, 150 sets are arranged in X axis direction, and a total of 1200 actuators 7 are arranged.

A plurality of nozzles 51 for ejecting ink are arranged on a front surface 10s of the head substrate 10. The nozzles 51 are two-dimensionally arranged in the column direction (X direction) and the row direction (Y direction). However, the nozzles 51 arranged in the row direction (Y direction) are arranged obliquely so that the nozzles 51 do not overlap on the axis of the Y axis. The ink ejected from each nozzle 51 is supplied from the ink supply path 52 communicating with the nozzle 51.

In addition, the head substrate 10 has discrete wirings 11 and a common wiring 16. The discrete wirings 11 and the common wiring 16 are connected to the actuators 7.

The discrete wirings 11 are disposed in parallel from the respective actuators 7 to the edge 10b on the input side on the front surface 10s. The drive potential V1 or the reference potential GND is supplied to the discrete wirings 11.

The number of the discrete wirings 11 is the same as the number of the actuators 7. The number of the discrete wirings 11 is 1200, for example.

Wirings extending from the actuators 7 to the common wiring 16 are disposed in parallel to each other from the respective actuators 7 toward the edge 10a on the output side on the front surface 10s. These wirings connected to the actuators 7 are commonly connected to the common wiring 16 at the edge 10a, and the common wiring 16 is disposed toward both left and right ends along the edge 10a. Further, the common wiring 16 is disposed from both left and right ends of the edge 10a to the edge 10b along the edges 10c and 10d on the left and right sides. That is, the common wiring 16 is a single wiring, is disposed along the edges 10a, 10c, and 10d except for the edge 10b, is further branched from the edge 10a.

The reference potential GND is supplied to the common wiring 16.

Common wirings 16L and 16R are respectively arranged at both left and right ends at the edge 10b of the head substrate 10. The plurality of discrete wirings 11 are arranged between the common wirings 16L and 16R. The discrete wirings 11 are divided into two on the left and right sides of the edge 10b. For example, 500 discrete wirings 11 are arranged on the left side, and 500 discrete wirings 11 are arranged on the right side of the edge 10b.

Since the discrete wirings 11 are divided into two on the left and right sides of the edge 10b, the discrete wirings 11 are disposed so as to be inclined relative to X direction between the actuators 7 and the edge 10b.

The discrete wirings 11 and the common wiring 16 are formed of nickel, aluminum, gold, or an alloy thereof. Since these wirings are formed through a semiconductor process, film thicknesses of conductive bodies are relatively thin.

Specifically, line thicknesses of the discrete wirings 11 and the common wiring 16 are 0.4 μm (see FIGS. 3A and 3B).

The line width, the wiring interval, and the arrangement interval (pitch) of the discrete wirings 11 are 20 μm, 20 μm, and 40 μm, respectively, at the edge 10b. The line widths of the common wirings 16L and 16R are 0.8 mm (see FIGS. 3C and 3D).

Flexible Substrate 20

The flexible substrate 20 is a one-sided soft substrate made of a synthetic resin film such as polyimide, and a planar shape thereof is a rectangular shape. The flexible substrate 20 is also referred to as a flexibility film substrate or a flexible film substrate (flexible printed circuit: FPC). A flexible substrate 20L on the left side and a flexible substrate 20R on the right side have the same shape and configuration.

Each flexible substrate 20 has a single drive IC 8. The drive IC 8 is mounted on a rear surface 20t, which is a surface opposite to a front surface of the flexible substrate 20 depicted in FIG. 2. The drive IC 8 is arranged in the left-right direction at the center of the flexible substrate 20, and the respective terminals are sealed with resin.

Since the flexible substrate 20 can be considered as a package of the drive IC 8, a sealed state in which the drive IC 8 is mounted on the flexible substrate 20 is also referred to as a tape carrier package (TCP) or a chip-on-film (COF) package.

In addition, each flexible substrate 20 has output wirings 21, input wirings 22, a power source wiring 23, aground wiring 24, output monitor wirings 25, and common connection wirings 26.

The wirings except for the common connection wirings 26 are connected to the drive IC 8. That is, the output wirings 21, the input wirings 22, the power source wiring 23, the ground wiring 24, and the output monitor wirings 25 are connected to the drive IC 8.

Meanwhile, the common connection wirings 26 are independently disposed without being connected to the drive IC 8 and the other wirings.

The output wirings 21 are disposed in parallel to each other from the drive IC 8 to the edge 20a on the output side on the rear surface 20t. The output wirings 21 are respectively connected to a plurality of output terminals provided on the rear surface of the drive IC 8. The drive potential V1 or the reference potential GND is supplied to the output wirings 21.

The number of output wirings 21 is one half of the number of the discrete wirings 11. The number of the output wirings 21 is 600, for example.

The input wirings 22 are disposed in parallel to each other from the drive IC 8 to the edge 20b on the input side on the rear surface 20t. The input wirings 22 are respectively connected to a plurality of input terminals that are provided on the rear surface of the drive IC 8. A control signal is supplied to the input wirings 22.

The number of input wirings 22 is smaller than the number of the output wirings 21.

The power source wiring 23 and the ground wiring 24 are wirings that are arranged in such a manner in which these wirings travel across a region on which the drive IC 8 is mounted, in the left-right direction, are bent at a substantially right angle on both left and right ends, and are disposed in parallel to each other. That is, the power source wiring 23 and the ground wiring 24 are disposed to surround the output side and both left and right sides of the input wiring 22.

The power source wiring 23 is connected to a plurality of power source terminals that are provided on the rear surface of the drive IC 8. The drive potential V1 is supplied to the power source wiring 23.

The ground wiring (first reference potential wiring) 24 is connected to a plurality of ground terminals that are provided on the rear surface of the drive IC 8. The reference potential GND is supplied to the ground wiring 24.

The number of the power source wirings 23 is one, and the number of the ground wirings 24 is one. The power source wiring 23 is arranged on the output side and the left and right outer sides, and the ground wiring 24 is arranged on the input side and the left and right inner sides.

The output monitor wirings 25 are two wirings that are disposed from the drive IC 8 to the edge 20b on the input side. The output monitor wirings 25 may be connected to any of a plurality of output terminals that are provided on the rear surface of the drive IC 8. That is, the output monitor wirings 25 may be connected to any of the plurality of output wirings 21. Drive waveforms that are changed between the drive potential V1 and the reference potential GND by the drive IC 8 are supplied to the output monitor wirings 25.

One output monitor wiring 25 is arranged on each of the left and right sides. Each output monitor wiring 25 is extracted from ends of the output wirings 21, is directed from the region on which the drive IC 8 is mounted to both left and right ends, is bent at a right angle, and is disposed to reach the edge 20b. The output monitor wirings 25 are arranged on the output side and the left and right outer sides of the power source wiring 23 and are disposed in parallel to the power source wiring 23.

The common connection wirings 26 are two wirings disposed in the upper-lower direction along the left and right edges 20c and 20d on the rear surface 20t. That is, a common connection wiring 26L is arranged on the leftmost edge while a common connection wiring 26R is arranged on the rightmost edge. The common connection wirings 26L and 26R are disposed to directly connect the edge 20b and the edge 20a without being connected to the drive IC 8 and the like. The reference potential GND is supplied to the common connection wirings 26.

The ground wiring 24 and the common connection wirings 26 are separate from each other. In other words, the ground wiring 24 and the common connection wirings 26 are independently connected to the relay substrate 30 and are electrically connected to each other on the relay substrate 30.

A plurality of input wirings 22 are aligned at the edge 20*b* of the flexible substrate 20, the ground wiring 24 is disposed outside the plurality of input wirings 22, and the power source wiring 23 is disposed further outside the ground wiring 24. Since the flexible substrate 20 is a one-sided substrate, wirings on the flexible substrate cannot cross the other wirings.

Basically, since the common connection wirings 26 and the drive IC 8 are separate from each other on the flexible substrate 20, it is possible to dispose the route of the output monitor wirings 25 to start from any of the output wirings 21, pass between the common connection wirings 26 and the power source wiring 23, and reach the edge 20*b* without crossing the other wirings.

Note that the embodiment is not limited to a case in which the power source wiring 23 is disposed outside the ground wiring 24, and the ground wiring 24 may be disposed outside the power source wiring 23 in some cases.

The output wirings 21, the input wirings 22, the power source wiring 23, the ground wiring 24, the output monitor wirings 25, and the common connection wirings 26 are formed of copper. These wirings are formed by using an adhesive on a polyimide film or by performing electrolytic lamination and then performing patterning thereon. Therefore, the conductive body thicknesses are thicker than those of the respective wirings (the discrete wirings 11 and the common wiring 16) on the head substrate 10. The line thicknesses of the respective wirings from the output wirings 21 to the common connection wirings 26 are 8 μm (see FIGS. 3A and 3B).

At the edge 20*a*, the arrangement interval (pitch) of the output wirings 21 is 40 μm, which is the same as that of the discrete wirings 11. The line width of the output wirings 21 is 18 μm, which is smaller than that of the discrete wirings 11. The wiring interval of the output wirings 21 is 22 μm, which is greater than that of the discrete wirings 11 (see FIG. 3D).

Since the conductive bodies (the respective wirings) on the flexible substrate 20 have thicknesses that are about twenty times larger than those of the conductive bodies on the head substrate 10, sheet resistance is substantially lower than that of the conductive bodies on the head substrate 10. If the widths (line widths) of the conductive bodies on the head substrate 10 with the high sheet resistance are reduced, wiring resistance significantly increases. Meanwhile, an increase in resistance is relatively small even if the widths (line widths) of the conductive bodies on the flexible substrate 20 with low sheet resistance are reduced. By reducing the widths of the conductive bodies of the output wirings 21 on the polyimide film side, which is relatively less influenced by the increase in resistance even if the widths of the conductive bodies are narrowed, to 18 μm and setting a wiring interval to be as large as 22 μm corresponding to the narrowed width, the increase in resistance is suppressed, and insulating defects are prevented even if deviation occurs during connection.

The line width of the common connection wiring 26 is 0.4 mm, which is a half of those of the common wirings 16L and 16R (see FIG. 3C).

Since the thicknesses of the conductive bodies (the respective wirings) on the flexible substrate 20 are about twenty times as thick as those of the conductive bodies on the head substrate 10, sheet resistance is sufficiently lower than that of the conductive bodies on the head substrate 10. If the widths (line widths) of the conductive bodies on the head substrate 10 with high sheet resistance is reduced, wiring resistance significantly increases. Meanwhile, an increase in resistance is relatively small even if the widths (line widths) of the conductive bodies on the flexible substrate 20 with low sheet resistance are reduced. By setting the width of the conductive body of the common connection wiring 26 on the polyimide film side, which is relatively less influenced by the increase in the resistance even if the width of the conductive body is reduced, to 0.4 mm, it is possible to suppress the increase in resistance and also to suppress the length of the polyimide film in the X direction. In this manner, it is possible to improve operability in bonding between the flexible substrate 20 and the head substrate 10, to suppress manufacturing costs, and to suppress film costs.

The common connection wirings 26L and 26R are arranged at both left and right ends at the edge 20*a* of the flexible substrate 20. The plurality of output wirings 21 are arranged at the center of the edge 20*a*.

In this manner, if the flexible substrate 20L is bonded to the left side of the edge 10*b* of the head substrate 10, the common connection wiring 26L is connected to the common wiring 16L, and the output wirings 21 are respectively connected to the discrete wirings 11 (connection locations). The common connection wiring 26R of the flexible substrate 20L may not be connected to any wirings of the head substrate 10 and the relay substrate 30, and therefore may be referred to as a dummy wiring.

If the flexible substrate 20R is bonded to the right side of the edge 10*b* of the head substrate 10, the common connection wiring 26R is connected to the common wiring 16R, and the output wirings 21 are respectively connected to the discrete wirings 11 (connection locations). The common connection wiring 26L of the flexible substrate 20L may not be connected to any wirings of the head substrate 10 and the relay substrate 30, and therefore may be referred to as a dummy wiring.

The flexible substrate 20 and the head substrate 10 are connected via an anisotropic conductive film (ACF). The ACF is arranged between the edge 20*a* of the rear surface 20*t* of the flexible substrate 20 and the edge 10*b* of the front surface 10*s* of the head substrate 10.

If the flexible substrate 20 and the head substrate 10 are thermally press-fitted to each other with a heater or the like with the ACF interposed therebetween, the flexible substrate 20 and the head substrate 10 can be bonded to each other, and therefore, the respective wirings can be electrically connected to each other. For example, the common wirings 16L and 16R and the common connection wirings 26L of the flexible substrate 20L and 26R of the flexible substrate 20R are electrically connected to each other.

In a case in which stretching of the flexible substrate during the thermal pressing cannot be ignored, the arrangement interval (pitch) may be narrower than 40 μm in a state before the connection such that the arrangement interval (pitch) after the connection becomes 40 μm.

The common connection wirings 26L and 26R are arranged at both left and right ends at the edge 20*b* of the flexible substrate 20. A plurality of input wirings 22 are arranged at the center of the edge 20*b*. Further, the output monitor wiring 25, the power source wiring 23, and the ground wiring 24 are arranged between the common connection wiring 26L and the input wirings 22. Similarly, the output monitor wiring 25, the power source wiring 23, and the ground wiring 24 are arranged between the common connection wiring 26R and the input wirings 22.

At the edge 20*b*, the line width, the wiring interval, and the arrangement interval (pitch) of the input wirings 22 are 0.15 mm, 0.15 mm, and 0.3 mm, respectively (see FIG. 3E). The line width of the output monitor wirings 25 is 100 μm. The line widths of the power source wiring 23, the ground wiring 24, and the common connection wiring 26 are 0.4 mm.

Relay Substrate 30

The relay substrate 30 is a hard multilayered substrate in which epoxy resin layers with glass fibers and copper wiring layers are laminated, and a planar shape thereof is a rectangular shape. The relay substrate 30 may be a printed circuit board or the like.

The relay substrate 30 has electronic parts and a connector disposed and/or formed thereon. The relay substrate 30 has input wirings 32, power source wirings 33, ground wirings 34, and output monitor wirings 35.

The input wirings 32, the power source wirings 33, and the ground wirings 34 are connected to the connector.

The output monitor wiring 35 is connected to a monitor pin 37 that extends from a front surface 30s of the relay substrate 30.

The input wirings 32 are a plurality of wirings that are disposed in parallel to each other from the edge 30a on the output side toward the connector. The input wirings 32 are exposed on the front surface 30s at the edge 30a and are arranged inside the layers at locations other than the edge 30a.

The number of input wirings 32 is the same as the number of input wirings 22.

A control signal for the drive IC 8 is supplied from a printer control unit to the input wirings 32 via serial communication. That is, a control signal for controlling the actuators 7 is input from the printer control unit to the input wirings 32 via the connector or the like.

The power source wirings 33 and the ground wirings 34 are wirings that are disposed in parallel to each other from the edge 30a toward the connector. The power source wirings 33 are exposed on the front surface 30s at the edge 30a and are arranged inside the layers at locations other than the edge 30a. The ground wiring (second reference potential wiring) 34 is exposed on the front surface 30s at the edge 30a.

The power source wirings 33 are branched into four at the edge 30a. Two power source wirings 33 are arranged on the left side of the edge 30a, and two power source wirings 33 are arranged on the right side thereof.

The drive potential V1 for driving the actuators 7 is supplied from a power source unit (see FIG. 2B) to the power source wirings 33 via the connector or the like.

The ground wirings 34 are branched into six at the edge 30a. Two ground wirings 34 are arranged on the left side of the edge 30a, and two ground wirings 34 are arranged on the right side thereof. Further, one ground wiring 34 is arranged at each of both left and right ends of the edge 30a (ground wirings 34L and 34R).

The two ground wirings 34 are disposed in parallel to each other on an inner side of the two power source wirings 33 on left and right sides of the edge 30a. The ground wirings 34L and 34R are disposed in parallel to each other on an outer side of the power source wirings 33 at both left and right sides of the edge 30a.

The reference potential GND that causes the actuators 7 to discharge electricity is supplied from the power source unit to the ground wirings 34 via the connector.

The output monitor wirings 35 are four wirings that are disposed from the edge 30a to the four monitor pins 37. The four monitor pins 37 are arranged at arbitrary locations on the front surface 30s of the relay substrate 30. A necessity of adjusting drive waveforms in accordance with ink properties occurs in the ink jet head 3 in some cases. In those cases, it is possible to connect a measurement device such as an oscilloscope to the four monitor pins 37 and to check the drive waveforms.

The output monitor wirings 35 are exposed on the front surface 30s at the edge 30a and are arranged inside the layers at locations other than the edge 30a.

The output monitor wirings 35 are disposed on an outer side of the power source wirings 33 at the edge 30a. The two output monitor wirings 35 are arranged in parallel to each other at the center of the edge 30a. The output monitor wirings 35 are disposed in parallel to each other between the ground wirings 34L and 34R and the power source wirings 33 at both left and right ends of the edge 30a.

The input wirings 32, the power source wirings 33, the ground wirings 34, and the output monitor wirings 35 are formed of copper. The line thicknesses of the respective wirings from the input wirings 32 to the output monitor wirings 35 are 35 μm (see FIGS. 3A and 3B). The line thicknesses of the conductive bodies (the respective wirings) on the relay substrate 30 are thicker than those of the conductive bodies on the flexible substrate 20.

At the edge 30a, the arrangement interval (pitch) of the input wirings 32 is 0.3 mm, which is the same as that of the input wirings 22. The line width of the input wirings 32 is 0.1 mm, which is smaller than that of the input wirings 22. The interval of the input wirings 32 is 0.2 mm, which is larger than that of the input wirings 22 (see FIG. 3E).

Since the thicknesses of the conductive bodies (the respective wirings) on the relay substrate 30 are about 4 times as thick as those of the conductive bodies on the flexible substrate 20, sheet resistance is lower than that of the wirings on the head substrate 10. Therefore, an increase in resistance is relatively small even if the widths (line widths) of the conductive body on the relay substrate 30 are reduced.

The width of the input wirings 32 on the side of the relay substrate, which is relatively less influenced by the increase in resistance even if the widths of the conductive bodies are reduced, is set to 0.1 mm, which is narrower than 0.15 mm, which is the width of the conductive bodies of the input wirings 22. By setting the wiring interval to be as wide as 0.2 mm corresponding to the reduction in width of the input wirings 32, the increase in resistance is suppressed, and insulating defects are prevented even if deviation occurs during connection.

That is, this is similar to the aforementioned relationship between the discrete wirings 11 on the head substrate 10 and the output wirings 21 on the flexible substrate 20.

When two wiring substrates with different sheet resistance are connected to each other, the line width and the wiring interval of the first wirings on the first wiring substrate on the side of high sheet resistance are set to 1:1, and the line width of second wirings on the second wiring substrate on the side of low sheet resistance is set to be narrower than the wiring interval thereof even if the pitch thereof is the same as that of the first wirings. In this manner, it is possible to suppress an increase in resistance and to achieve connection that is less likely to cause insulating defects even if deviation occurs during the connection.

The line widths of the power source wirings 33 and the ground wirings 34 are 0.4 mm at the edge 30a. The line width of the output monitor wirings 35 is 100 μm.

At the edge 30a of the relay substrate 30, the ground wiring 34L, the output monitor wiring 35, the power source wiring 33, the ground wiring 34, the plurality of input wirings 32, the ground wiring 34, the power source wiring 33, and the output monitor wiring 35 are arranged in this order from the left side to the center.

At the edge 30a of the relay substrate 30, the ground wiring 34R, the output monitor wiring 35, the power source wiring 33, the ground wiring 34, the plurality of input wirings 32, the ground wiring 34, the power source wiring 33, and the output monitor wiring 35 are arranged in this order from the right side to the center.

In this manner, if the flexible substrate 20L is bonded to the left side of the edge 30a of the relay substrate 30, the respective wirings are connected to each other. That is, the input wirings 32 are connected to the input wirings 22, the power source wirings 33 are connected to the power source wiring 23, the ground wirings 34 are connected to the ground wiring 24, and the output monitor wirings 35 are connected to the output monitor wirings 25. The ground wiring 34L is respectively connected to the common connection wiring 26L on the flexible substrate 20L.

If the flexible substrate 20R is bonded to the right side of the edge 30a of the relay substrate 30, the respective wirings are connected to each other. That is, the input wirings 32 are connected to the input wirings 22, the power source wirings 33 are connected to the power source wiring 23, the ground wirings 34 are connected to the ground wiring 24, and the output monitor wirings 35 are connected to the output monitor wirings 25. The ground wiring 34R is respectively connected to the common connection wiring 26R on the flexible substrate 20R.

The relay substrate 30 and the two flexible substrates 20 are connected to each other via an ACF. The ACF is arranged between the edge 30a of the front surface 30s of the relay substrate 30 and the edge 20b of the rear surface 20t of the flexible substrate 20.

If the edge 30a of the relay substrate 30 and the edge 20b of the flexible substrate 20 are thermally press-fitted by a heater or the like with the ACF interposed therebetween, the relay substrate 30 and the two flexible substrates 20 can be bonded to each other, and further, the respective wirings can be electrically connected to each other. For example, the common connection wirings 26L and 26R and the ground wirings 34L and 34R are electrically connected to each other.

Figure 4:
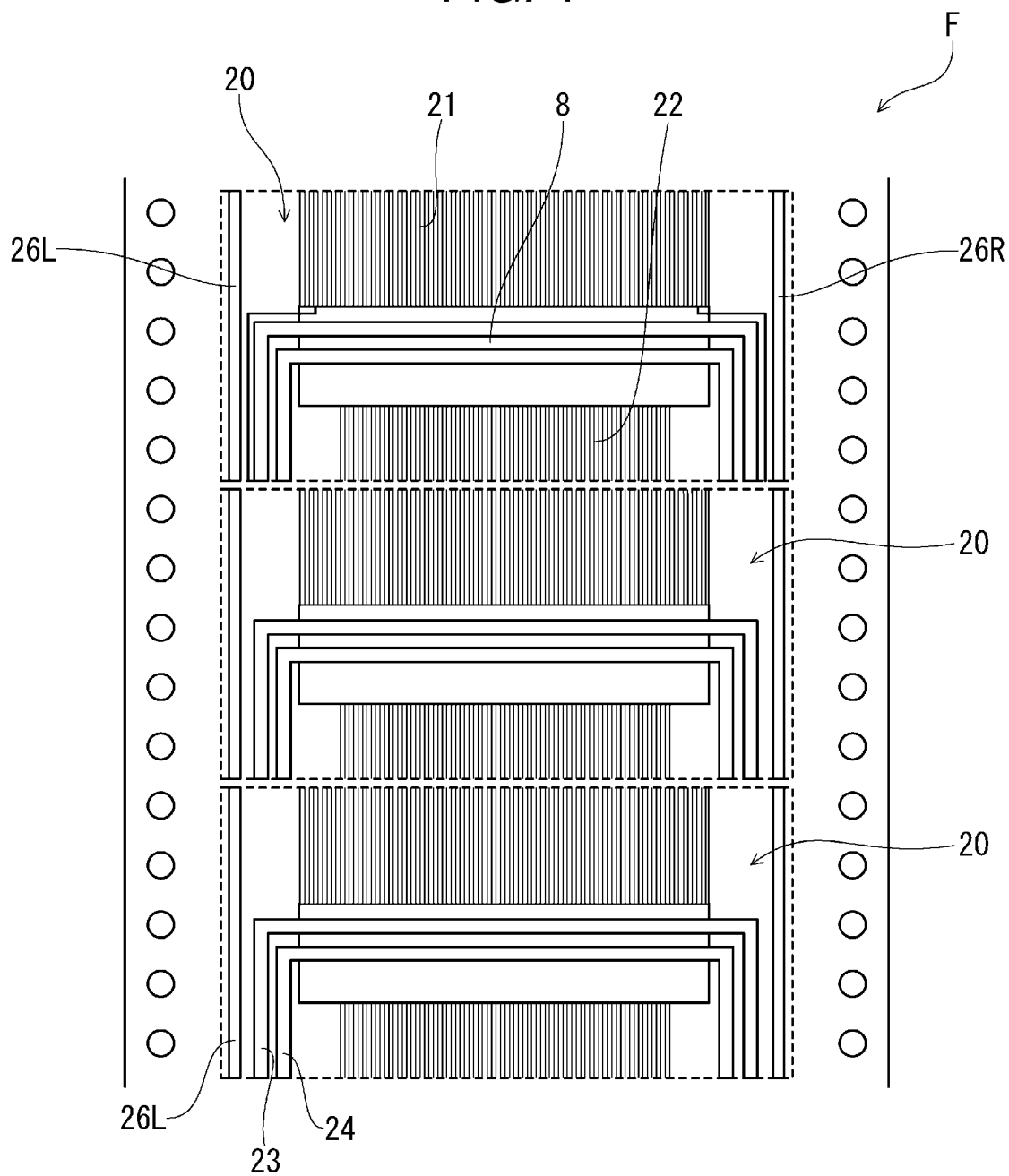
FIG. 4 is a diagram illustrating flexible substrates formed in a sprocket film.

FIG. 4 is a diagram illustrating the flexible substrates 20 formed on a sprocket film F. The flexible substrates 20 are illustrated in such a manner in which the flexible substrates 20 are seen through a synthetic resin film.

A plurality of flexible substrates 20 are continuously formed on the sprocket film F, which is made of a synthetic resin such as polyimide. This plurality of flexible substrates 20 thus formed are transported to an assembling plant or the like for ink jet heads 3. These flexible substrates 20 can be transported while still in a sprocket film F state.

When the individual flexible substrates 20 are cut from the sprocket film F, outer perimeters (depicted as a broken line in FIG. 4) of the flexible substrates 20 are cut. In this manner, the flexible substrates 20 (20L and 20R) can be bonded to the head substrate 10 and the like.

In this manner, the ink jet head 3 can avoid complicated and thin common wirings (e.g., the ground wiring 24 and the common connection wiring 26) on the flexible substrates 20. Therefore, it is possible to manufacture the ink jet printer 1 that is less influenced by noise and can prevent degradation of ejection properties.

As described above, the line thickness (the thickness of the conductive body) of the common wiring 16 formed on the head substrate 10 of the ink jet head 3 is 0.4 µm, which is significantly thin. Since drive currents for all the actuators 7 are collected at the common wiring 16, unlike the discrete wirings 11, a large current flows therethrough. For that reason, the common wiring 16 requires a line width (the width of the conductive body) that is about 80 times as thick as that of the discrete wirings 11. In the present embodiment, two common wirings 16 with the line width of 0.8 mm are arranged at the edge 10b.

The line thickness of the common connection wiring 26 formed on the flexible substrate 20 is 8 µm, which is the thickness that is 20 times as thick as that of the common wiring 16. Since the cross-sectional area of the common connection wiring 26 is large even if the line width thereof is a half (0.4 mm) of the line width (0.8 mm) of the common wiring 16, the common connection wiring 26 has sufficiently low electric resistance.

If positional deviations in the left-right direction occur in the bonding between the head substrate 10 and the flexible substrates 20, there is a concern that a part of the common wiring 16 and a part of the common connection wiring 26 are connected to each other and the electric resistance at the connection location increases.

If the electric resistance at the connection location between the common wiring 16 and the common connection wiring 26 is high, a drive voltage of the actuators 7 drops, and stability of ink ejection deteriorates, or the common wiring 16 generates heat, and durability deteriorates.

In the ink jet head 3, the common wiring 16 with a large line width and the common connection wiring 26 with a small line width are connected to each other in an overlapping manner. For that reason, the common connection wiring 26 is reliably arranged within a range of the line width of the common wiring 16. Since the common wiring 16 of a conductive body with a small sectional area and with high (or equal) electric resistance is completely connected to the common connection wiring 26 of a conductive body with a large sectional area and with low electric resistance, it is possible to avoid an increase in the electric resistance at the connection location.

Therefore, positioning precision for bonding the head substrate 10 and the flexible substrates 20 does not increase, and it is possible to easily perform the bonding.

In the ink jet head 3, the ground wirings 34L and 34R that supply the reference potential GND only to the actuators 7 are disposed on the relay substrate 30. According to this configuration, it is possible to provide switches or the like for the ground wirings 34L and 34R and to arbitrarily control the reference potential to be supplied to the actuator 7.

As illustrated in FIG. 1B, for example, it is possible to supply a negative potential V2 to the actuators 7 by switching the switches. In this manner, it is possible to perform polling processing on the actuators 7.

It is also possible to make the potential of the common wiring 16 different from the Gnd potential, variable and to adjust a bias voltage to be applied to the actuators 7.

In the ink jet head 3, the common connection wiring 26 that supplies the reference potential to the actuators 7 and the ground wiring 24 that supplies the reference potential to the drive IC 8 are separately and independently provided on the flexible substrate 20. According to this configuration, it is possible to dispose the output monitor wirings 25 between the output wirings 21 of the drive IC 8 and the common connection wiring 26. The output monitor wirings 25 are connected to any of the plurality of output terminals of the drive IC 8 and are connected to the output monitor wirings 35 on the relay substrate 30.

According to this connection, it is possible to check output waveforms of the drive IC 8 on the relay substrate 30. In other words, it is not necessary to check the output waveforms of the drive IC 8 on the flexible substrates 20 as in the related art.

Therefore, it is possible to easily check the output waveforms of the drive IC 8 when the ink jet head 3 is developed or malfunction thereof is analyzed.

Second Embodiment

Ink Jet Head 4

Figure 5A:
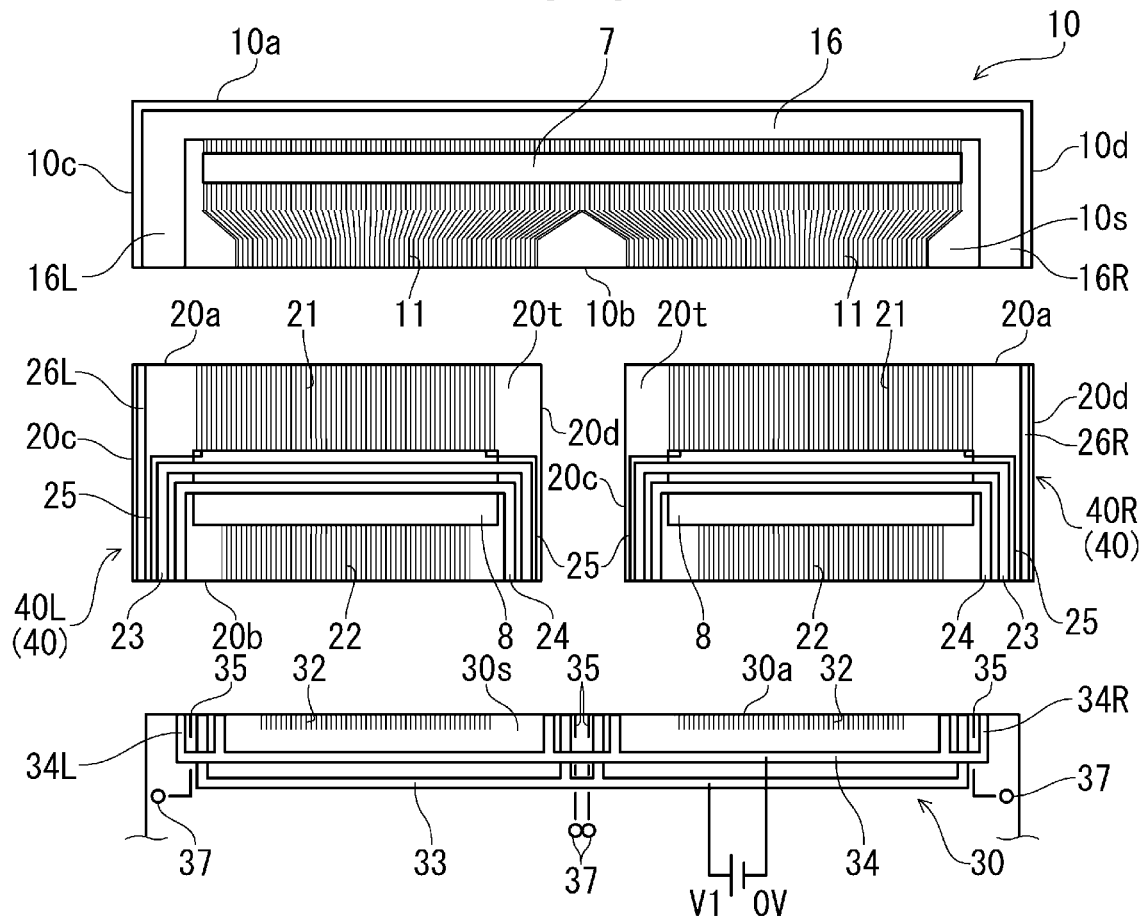
FIGS. 5A and 5B are diagrams illustrating an ink jet head according to a second embodiment, where
Figure 5B:
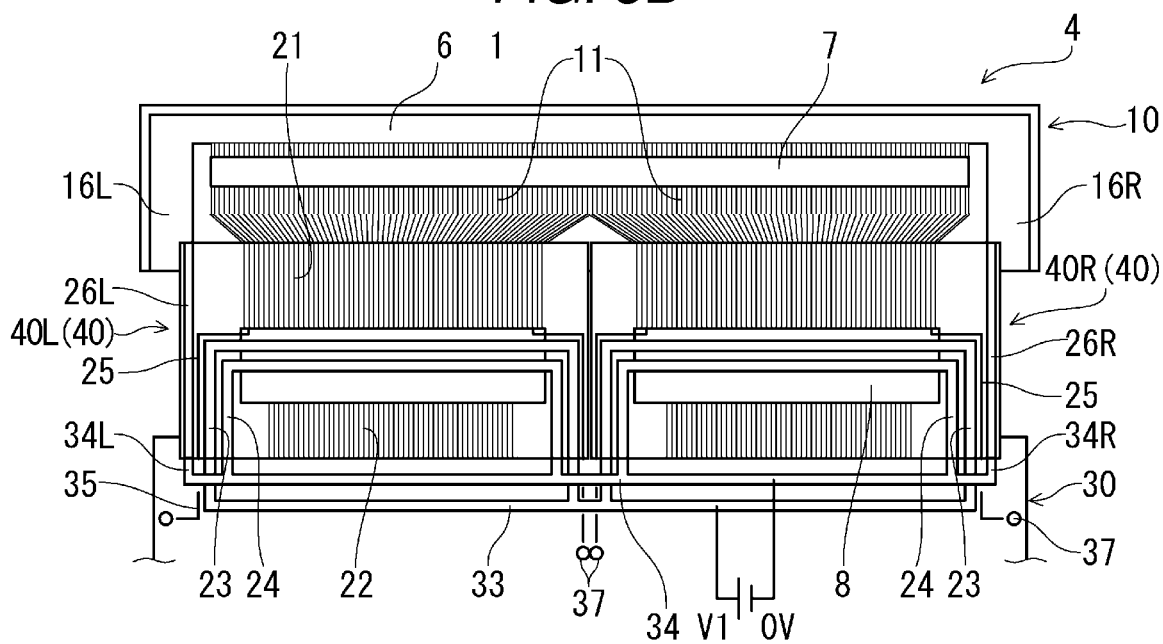

FIGS. 5A and 5B are diagrams illustrating an inkjet head 4 according to a second embodiment, where FIG. 5A illustrates a state before bonding and FIG. 5B illustrates a state after bonding. Wirings and the like on flexible substrates 40 and a relay substrate 30 are illustrated in such a manner in which the wirings and the like are seen through the substrates for convenience of explanation.

The same reference numerals will be used for the same aspects as those in the ink jet head 3 according to the first embodiment, and description thereof is omitted.

The ink jet head 4 includes a head substrate 10, the flexible substrates 40, and the relay substrate 30. Two flexible substrates 40 are bridged in parallel to each other between the head substrate 10 and the relay substrate 30.

Flexible Substrate 40

The flexible substrates 40 have substantially the same configuration as that of the flexible substrates 20.

A flexible substrate 40L on the left side does not have the common connection wiring 26R, and a flexible substrate 40R on the right side does not have the common connection wiring 26L. That is, the flexible substrate 40L is obtained by removing the common connection wiring 26R from the flexible substrates 20, and the flexible substrate 40R is obtained by removing the common connection wiring 26L from the flexible substrates 20.

FIG. 6 is a diagram illustrating the flexible substrates 40 formed in a sprocket film F. The flexible substrates 40 are illustrated in a manner in which the flexible substrate 40 is seen through a synthetic resin film for convenience of explanation.

The flexible substrates 40 are formed continuously on the sprocket film F. This plurality of flexible substrates 40 are transported to an assembling plant while still in a sprocket film F state.

The flexible substrates 40 formed on the sprocket film F have substantially the same configuration as that of the flexible substrates 20 according to the first embodiment. That is, the flexible substrates 40 formed in the sprocket film F have two common connection wirings 26.

When the individual flexible substrates 40R are cut from the sprocket film F, the common connection wirings 26L are left in the sprocket film F (the broken line in FIG. 6). That is, the common connection wirings 26L are separated from the flexible substrates 40. In this manner, it becomes possible to bond each flexible substrate 40R to the head substrate 10 or the like.

When the individual flexible substrates 40L are cut from the sprocket film F, the common connection wirings 26R are left in the sprocket film F (the broken line in FIG. 6). That is, the common connection wirings 26R are separated from the flexible substrates 40. In this manner, it becomes possible to bond each flexible substrate 40L to the head substrate 10 or the like.

The ink jet head 4 provides effects and advantages that are similar to those of the ink jet head 3. That is, it is possible to avoid complicated and thin common wirings (the ground wiring 24 and the common connection wirings 26) on the flexible substrate 40 on which the drive IC 8 for driving the actuators 7 is mounted. Therefore, it is possible to provide the ink jet printer 1 capable of preventing degradation of ejection properties.

Further, the ink jet head 4 can improve manufacturing efficiency. That is, cut lines are differentiated when the individual flexible substrates 40 are cut from the sprocket film F. In this manner, it is possible to cut the flexible substrates 40L and 40R from the sprocket film F on which the plurality of flexible substrates 40 with the same configuration are formed.

Since it is only necessary to differentiate the cut lines, the manufacturing efficiency can be improved. Since it is not necessary to manufacture a plurality of types of substrates, it is possible to reduce costs.

As described above, the flexible substrate 40L does not have the common connection wiring 26R, and the flexible substrate 40R on the right side does not have the common connection wiring 26L in the ink jet head 4. For that reason, the widths of the two flexible substrates 40 decrease as compared with the first embodiment.

According to this configuration, it is possible to arrange the plurality of discrete wirings 11, which are divided into two on the left and right sides, near the center on the head substrate 10. That is, it is possible to form the direction in which the discrete wirings 11 are disposed to conform to the upper-lower direction.

If the discrete wirings 11 are disposed such that the discrete wirings 11 are inclined relative to X direction, electric resistance of the respective discrete wirings 11 would become nonuniform, and insulating reliability would deteriorate. Further, this may become a factor of lowering a yield of the head substrate 10.

Figure 12A:
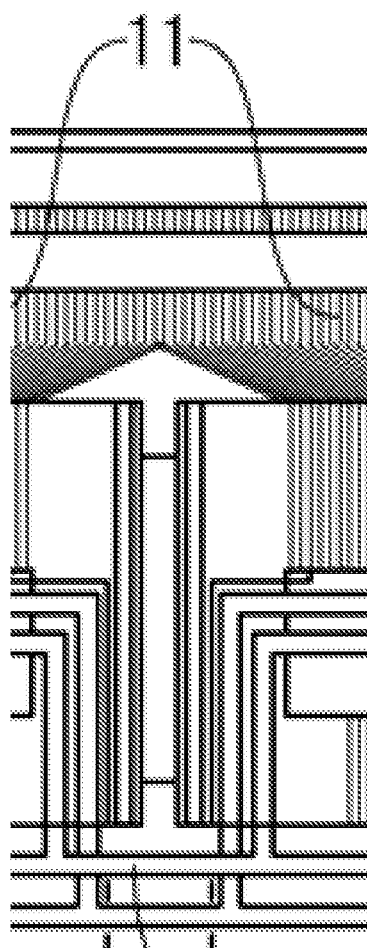
FIGS. 12A and 12B are diagrams illustrating enlarged views of ink jet heads, where
Figure 12B:
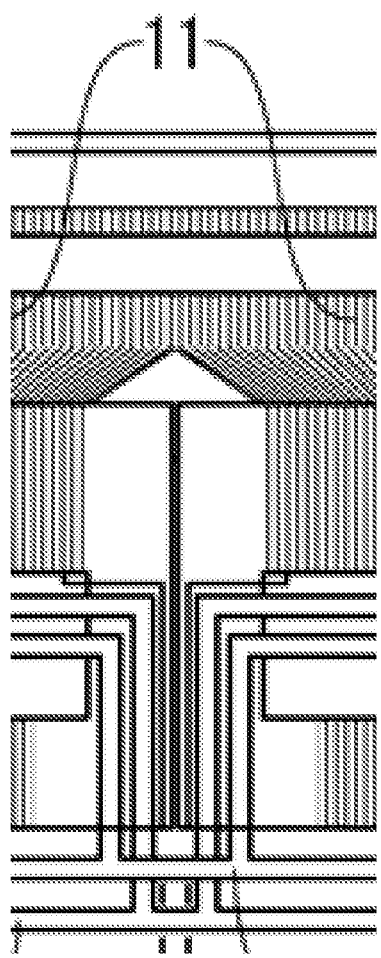

FIGS. 12A and 12B are diagrams illustrating enlarged views of inkjet heads, where FIG. 12A illustrates two flexible substrates separated from each other, and FIG. 12B illustrates two flexible substrates arranged in the vicinity of each other. According to the ink jet head 4, it is possible to decrease an inclination of the discrete wirings 11 at a center region corresponding to a space between the two flexible substrate 40 by arranging the two flexible substrates 40 in the vicinity of each other in the left-right direction as in FIG. 12B as opposed to that shown in FIG. 12A. It is possible to form the discrete wirings 11 along X direction. As a result, the electric resistance of the respective discrete wirings 11 becomes uniform, the insulating reliability can be improved, and the yield of the head substrate 10 can be improved.

Third Embodiment

Ink Jet Head 5

Figure 7:
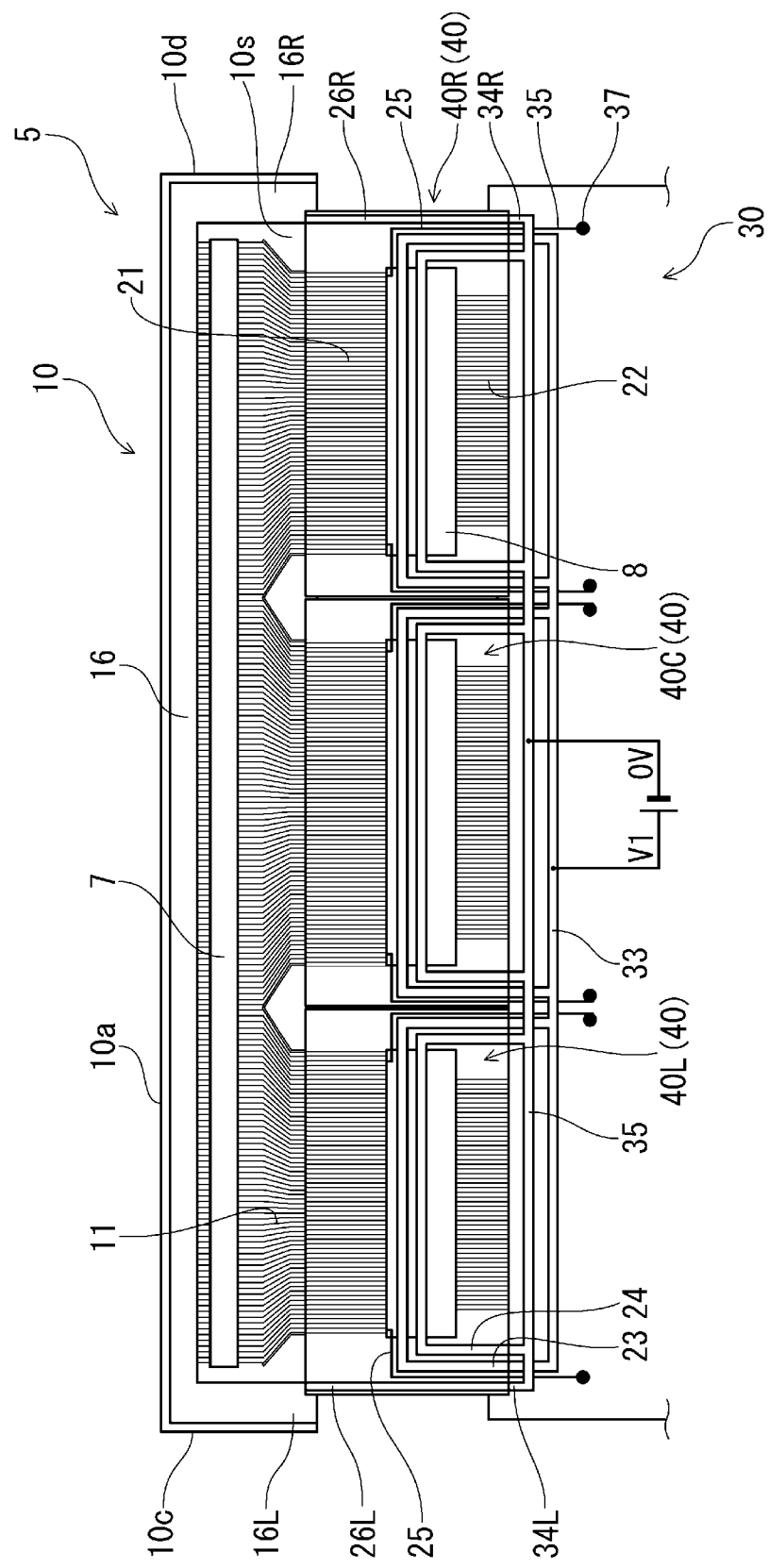
FIG. 7 is a diagram illustrating an ink jet head according to a third embodiment.

FIG. 7 is a diagram illustrating an ink jet head 5 according to a third embodiment. Wirings and the like on flexible substrates 40 and a relay substrate 30 are illustrated in such a manner in which the wirings and the like are seen through the substrates for convenience of explanation.

The same reference numerals will be used for the same members and the like as those in the ink jet heads 3 and 4 according to the first and second embodiments, and repeated description thereof will be omitted.

The ink jet head 5 includes a head substrate 10, the flexible substrates 40, and the relay substrate 30. Three flexible substrates 40L, 40C, and 40R are bridged in parallel to each other between the head substrate 10 and the relay substrate 30.

Flexible Substrate 40

The flexible substrate 40L on the left side does not have the common connection wiring 26R, and the flexible substrate 40R on the right side does not have the common connection wiring 26L. The flexible substrate 40C at the center does not have the common connection wiring 26. That is, the flexible substrate 40C is obtained by cutting two common connection wirings 26 from the flexible substrate 20.

Figure 8:
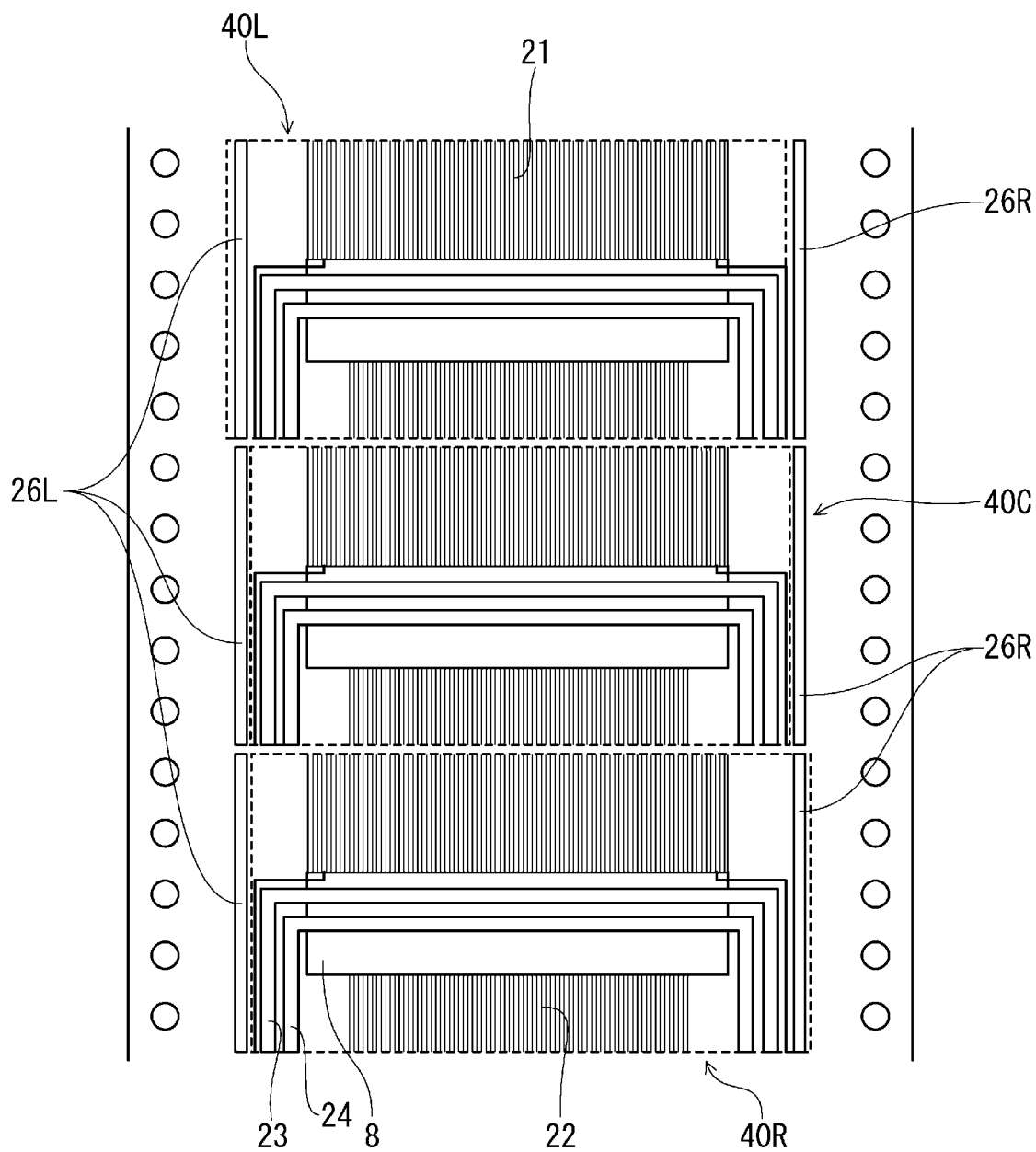
FIG. 8 is a diagram illustrating flexible substrates formed in a sprocket film.

FIG. 8 is a diagram illustrating the flexible substrates 40 formed in a sprocket film F. The flexible substrates 40 are illustrated in such a manner in which the flexible substrates 40 are seen through a synthetic resin film for convenience of explanation.

The flexible substrates 40 are formed continuously in the sprocket film F. The flexible substrates 40 formed in the sprocket film F have two common connection wirings 26.

When the individual flexible substrates 40R are cut from the sprocket film F, the common connection wirings 26L are left in the sprocket film F (the broken line in FIG. 8). The common connection wirings 26L are removed from the flexible substrates 40. As a result, it becomes possible to bond each flexible substrate 40R to the head substrate 10 or the like.

When the individual flexible substrates 40C are cut out of the sprocket film F, the common connection wirings 26L and 26R are left in the sprocket film F (the broken line in FIG. 8). The common connection wirings 26L and 26R are removed from the flexible substrates 40. As a result, it becomes possible to bond each flexible substrate 40C to the head substrate 10 or the like.

When the individual flexible substrates 40L are cut out of the sprocket film F, the common connection wirings 26R are left in the sprocket film F (the broken line in FIG. 8). The common connection wirings 26R are removed from the flexible substrate 40. As a result, it becomes possible to bond each flexible substrate 40L to the head substrate 10 or the like.

The ink jet head 5 provides similar effects and advantages as those of the ink jet heads 3 and 4. That is, it is possible to avoid complicated and thin common wirings (the ground wiring 24 and the common connection wiring 26) on the flexible substrate 40 on which the drive IC 8 for driving the actuators 7 is mounted. Therefore, it is possible to provide the ink jet printer 1 that is less influenced by noise and is capable of preventing degradation of ejection properties.

Further, the ink jet head 5 can improve manufacturing efficiency similarly to the inkjet head 4. That is, cut lines are differentiated when the individual flexible substrates 40 are cut from the sprocket film F. In this manner, it is possible to cut the flexible substrates 40L, 40C, and 40R from the sprocket film F in which the plurality of flexible substrates 40 with the same configuration are formed.

Since it is only necessary to differentiate the cut lines, the manufacturing efficiency is improved. Since it is not necessary to manufacture a plurality of types of substrates, it is possible to reduce costs.

In the ink jet head 5, the flexible substrate 40L does not have the common connection wiring 26R, the flexible substrate 40R on the right side does not have the common connection wiring 26L, and the flexible substrate 40C does not have the common connection wiring 26.

According to this configuration, it is possible to form the discrete wirings 11 along the upper-lower direction similarly to the ink jet head 5. As a result, electric resistance of the respective discrete wirings 11 becomes uniform, insulating reliability can be improved, and it is possible to improve a yield of the head substrate 10.

Fourth Embodiment

Ink Jet Head 6

Figure 9:
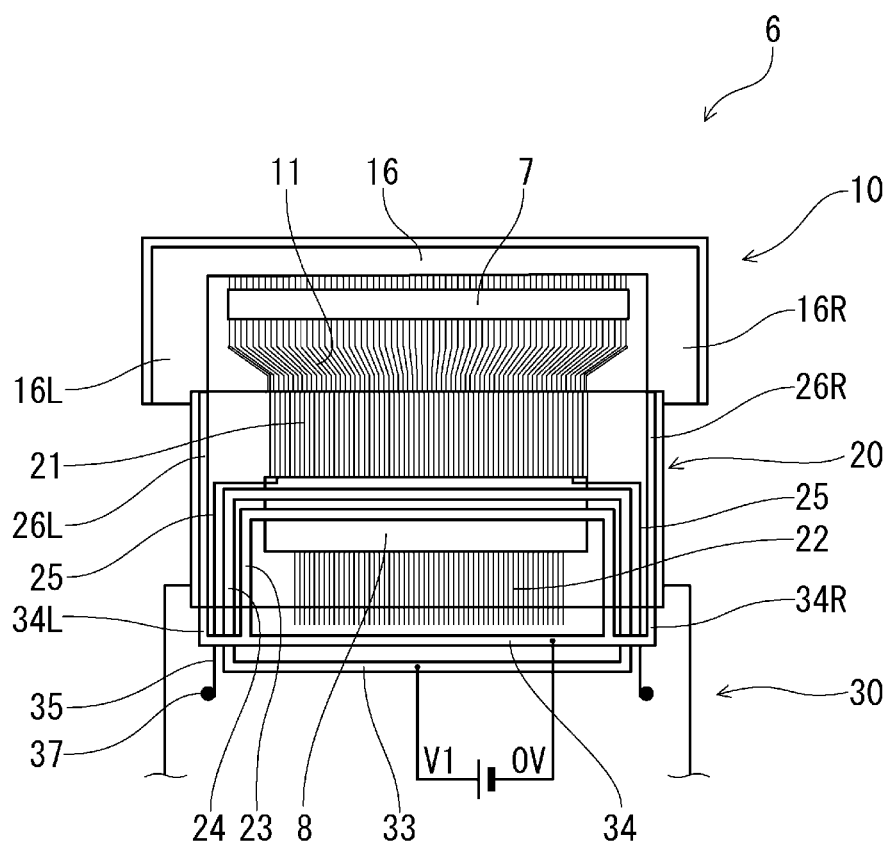
FIG. 9 is a diagram illustrating an ink jet head according to a fourth embodiment.

FIG. 9 is a diagram illustrating an ink jet head 6 according to a fourth embodiment. Wirings and the like on a flexible substrate 20 and a relay substrate 30 are illustrated in such a manner in which the wirings and the like are seen through the substrates for convenience of explanation.

The same reference numerals will be used for the same aspects and the like as those in the ink jet heads 3 to 5 according to the first to third embodiments, and repeated description thereof will be omitted.

The ink jet head 6 includes a head substrate 10, the flexible substrate 20, and the relay substrate 30. A single flexible substrate 20 is bridged between the head substrate 10 and the relay substrate 30.

The ink jet head 6 provides similar effects and advantages as those of the ink jet heads 3 to 5. That is, it is possible to avoid complicated and thin common wirings (the ground wiring 24 and the common connection wiring 26) on the flexible substrate 20 on which the drive IC 8 for driving the actuators 7 is mounted. Therefore, it is possible to provide the ink jet printer 1 that is less influenced by noise and is capable of preventing degradation of ejection properties.

The aforementioned respective embodiments are not limited to the case in which a single drive IC 8 is mounted on a single flexible substrate. Two or more drive ICs 8 may be mounted on a single flexible substrate. In this case, the two or more drive ICs 8 may be arranged in series in the left-right direction.

The elements that cause the nozzles to eject ink are not limited to the actuators 7 formed by the piezoelectric elements. The elements may be heaters or solenoids valves.

The shape of each substrate is not limited to a rectangular shape and may be a parallelogram, a trapezoid, or the like. The respective wirings are not limited to the case in which the wirings are disposed linearly or in parallel, and various modifications can be made as needed.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An ink jet head, comprising:
   a head substrate including thereon:
      a plurality of ink jet elements configured to cause ink to be ejected from a plurality of nozzles; and
      a common wiring extending from an edge of the head substrate and electrically connected in common to the ink jet elements;
   a flexible substrate having a first edge coupled to the edge of the head substrate and including thereon:
      a drive circuit configured to drive the ink jet elements;
      a common connection wiring extending between the first edge and a second edge of the flexible substrate opposite the first edge and electrically connected to the common wiring; and a first reference potential wiring disposed separately from the common connection wiring, extending from the second edge of the flexible substrate, and electrically connected to a reference voltage terminal of the drive circuit; and a relay substrate coupled to the second edge of the flexible substrate and having a second reference potential wiring thereon, the second reference potential wiring being electrically connected to the common connection wiring and the first reference potential wiring.

2. The ink jet head according to claim 1, further comprising:
a power supply wiring on the flexible substrate, the power supply wiring connected to a power supply terminal of the drive circuit.

3. The ink jet head according to claim 1, wherein the common connection wiring is formed along a third edge of the flexible substrate, the third edge being aligned perpendicular to the first and second edges.

4. The ink jet head according to claim 3, further comprising:
a dummy wiring on the flexible substrate, the dummy wiring disposed separately from the first reference potential wiring and extending between the first and second edges of the flexible substrate along a fourth edge of the flexible substrate opposite the third edge.

5. The ink jet head according to claim 4, wherein the dummy wiring is electrically isolated from any wiring on the head substrate and any wiring on the relay substrate.

6. The ink jet head according to claim 4, wherein the common connection wiring and the dummy wiring are disposed symmetrically with respect to a center line of the flexible substrate extending between the first and second edges.

7. The ink jet head according to claim 4, further comprising:
a power supply wiring on the flexible substrate, the power supply wiring connected to a power supply terminal of the drive circuit and having a portion extending between the dummy wiring and the first reference potential wiring.

8. The ink jet head according to claim 3, further comprising:
a second common connection wiring on the flexible substrate, the second common connection wiring disposed separately from the first reference potential wiring and extending between the first and second edges of the flexible substrate along a fourth edge of the flexible substrate opposite the third edge, the second common connection wiring being electrically connected to the common wiring and the second reference potential wiring.

9. The ink jet head according to claim 1, wherein a width of the flexible substrate in a direction along the first edge is less than a width of the head substrate in the direction along the first edge.

10. The ink jet head according to claim 1, wherein a width of the flexible substrate in a direction along the first edge is less than a width of the relay substrate in the direction along the first edge.

11. An ink jet printer, comprising:
an ink jet head;
an ink supply device configured to supply ink to the ink jet head; and
a conveying device configured to convey a print medium toward the ink jet head, wherein the ink jet head comprises:
a head substrate including thereon:
a plurality of ink jet elements configured to cause ink to be ejected from a plurality of nozzles; and
a common wiring extending from an edge of the head substrate and electrically connected in common to the ink jet elements;
a flexible substrate having a first edge coupled to the edge of the head substrate at a first edge of the flexible substrate and including thereon:
a drive circuit configured to drive the ink jet elements;
a common connection wiring extending between the first edge of the flexible substrate and a second edge of the flexible substrate opposite to the first edge and electrically connected to the common wiring; and
a first reference potential wiring disposed separately from the common connection wiring, extending from the second edge of the flexible substrate, and electrically connected to a reference voltage terminal of the drive circuit; and
a relay substrate coupled to the second edge of the flexible substrate and having a second reference potential wiring thereon, the second reference potential wiring being electrically connected to the common connection wiring and the first reference potential wiring.

12. The ink jet printer according to claim 11, further comprising:
a power supply wiring on the flexible substrate, the power supply wiring connected to a power supply terminal of the drive circuit.

13. The ink jet printer according to claim 11, wherein the common connection wiring is formed along a third edge of the flexible substrate, the third edge being aligned perpendicular to the first and second edges.

14. The ink jet printer according to claim 13, further comprising:
a dummy wiring on the flexible substrate, the dummy wiring disposed separately from the first reference potential wiring and extending between the first and second edges of the flexible substrate along a fourth edge of the flexible substrate opposite the third edge.

15. The ink jet printer according to claim 14, wherein the dummy wiring is electrically isolated from any wiring on the head substrate and any wiring on the relay substrate.

16. The ink jet printer according to claim 14, wherein the common connection wiring and the dummy wiring are disposed symmetrically with respect to a center line of the flexible substrate extending between the first and second edges.

17. The ink jet printer according to claim 14, further comprising:
a power supply wiring on the flexible substrate, the power supply wiring connected to a power supply terminal of the drive circuit and having a portion extending between the dummy wiring and the first reference potential wiring.

18. The ink jet printer according to claim 13, further comprising:
a second common connection wiring on the flexible substrate, the second common connection wiring disposed separately from the first reference potential wiring and extending between the first and second edges of the flexible substrate along a fourth edge of the flexible substrate opposite the third edge, the second common connection wiring being electrically connected to the common wiring and the second reference potential wiring.

19. The ink jet printer according to claim 11, wherein a width of the flexible substrate in a direction along the first edge is less than a width of the head substrate in the direction along the first edge.

20. The ink jet printer according to claim 11, wherein a width of the flexible substrate in a direction along the first edge is less than a width of the relay substrate in the direction along the first edge.

\* \* \* \* \*